(12) United States Patent
Gho et al.

(10) Patent No.: US 7,849,386 B2
(45) Date of Patent: Dec. 7, 2010

(54) DECODER AND METHOD FOR DECODING A TAIL-BITING CONVOLUTIONAL ENCODED SIGNAL USING VITERBI DECODING SCHEME

(75) Inventors: Gwang-Hyun Gho, Cupertino, CA (US); Won-Joon Choi, Cupertino, CA (US); Chaohuang Zeng, Sunnyvale, CA (US)

(73) Assignee: Amicos Wireless Technology Ltd. (KY)

( * ) Notice: Subject to any disclaimer, the term of this patent is extended or adjusted under 35 U.S.C. 154(b) by 1002 days.

(21) Appl. No.: 11/621,958

(22) Filed: Jan. 10, 2007

(65) Prior Publication Data

US 2007/0174757 A1 Jul. 26, 2007

Related U.S. Application Data

(60) Provisional application No. 60/757,847, filed on Jan. 11, 2006.

(51) Int. Cl.
*H03M 13/03* (2006.01)
(52) U.S. Cl. .................................................... 714/795
(58) Field of Classification Search ................ 714/746, 714/786, 794–796; 375/265, 341
See application file for complete search history.

(56) References Cited

U.S. PATENT DOCUMENTS

| | | | |
|---|---|---|---|
| 5,355,376 A * | 10/1994 | Cox et al. .................. | 714/795 |
| 6,088,405 A | 7/2000 | Hladik et al. | |
| 6,877,132 B1 | 4/2005 | De et al. | |
| 6,901,118 B2 * | 5/2005 | Hocevar et al. ............. | 375/341 |
| 7,603,613 B2 * | 10/2009 | Pisek et al. .................. | 714/795 |
| 7,640,478 B2 | 12/2009 | Hedayat et al. | |
| 7,765,459 B2 * | 7/2010 | Chae et al. .................. | 714/795 |
| 7,792,205 B2 | 9/2010 | Zhang et al. | |

OTHER PUBLICATIONS

Lassing, J., Ottosson, T. and Strom, E., "Packet Error Rates of Terminated and Tailbiting Convolutional Codes," Advanced Signal Processing for Communication Systems, Copyright 2002 [retrieved Sep. 27, 2007 from the Internet <URL:http://www.elec.now.edu.au/staff/wysocki/dspcs/papers/015.pdf>.

* cited by examiner

*Primary Examiner*—Shelly A Chase
(74) *Attorney, Agent, or Firm*—Thomas H. Ham; Wilson & Ham (57) ABSTRACT

A decoder and method for decoding a tail-biting convolutional encoded signal using Viterbi decoding scheme performs a traceback operation for a first portion of a total code block, which includes a code block of the tail-biting convolutional encoded signal and a padded block. During the traceback operation for the first portion, a particular state at a predefined position within the first portion is stored as a circular state. The circular state is used as a traceback starting state for at least one subsequent portion of the total code block to produce a decoded signal of the code block.

20 Claims, 5 Drawing Sheets

DECODER AND METHOD FOR DECODING A TAIL-BITING CONVOLUTIONAL ENCODED SIGNAL USING VITERBI DECODING SCHEME

CROSS REFERENCE TO RELATED APPLICATION

This application is entitled to the benefit of U.S. Provisional Patent Application Ser. No. 60/757,847 filed on Jan. 11, 2006, which is incorporated herein by reference.

BACKGROUND OF THE INVENTION

Orthogonal Frequency Division Multiple Access (OFDMA) technology is getting very popular in modern communication systems since the OFDMA technology can efficiently support multiple mobile stations with limited bandwidth and easily provide Quality of Service (QoS). The OFDMA technology is a multiple access version of orthogonal frequency-division multiplexing (OFDM). OFDM is a modulation technique for data transmission based on frequency-division multiplexing (FDM), which uses different frequency channels to transmit multiple streams of data. In OFDM systems, a wide channel is divided into multiple narrow-band subcarriers, which allow orthogonal modulated streams of data to be transmitted in parallel on the subcarriers.

In OFDMA systems, multiple subscribers can simultaneously use different subcarriers for signal transmission. Thus, in an OFDMA system, multiple data bursts can be transmitted from a base station to multiple mobile stations in the same time frame but allocated in different frequency subcarriers. Consequently, an OFDMA system can support multiple mobile stations using different subcarriers.

In a conventional OFDMA transmitter, outgoing data is processed for wireless transmission as OFDMA signals, including being forward error correction encoded. Under the mobile WiMAX standard, the outgoing data can be encoded using a tail-biting convolutional encoding scheme. Thus, in an OFDMA receiver, the incoming OFDMA signals must be decoded using an appropriate decoding technique to extract the original data in the signals. One of the techniques to decode the incoming convolutional-encoded OFDMA signals is Viterbi decoding. However, Viterbi decoding has been applied in the past to situations where the initial and final states of the encoded signals were known to the receiver. Under the mobile WiMAX standard, the initial and final states are unknown to the receiver. The only information known to the receiver is that the initial and final states of the encoded signals are the same. Thus, conventional Viterbi decoding techniques are not appropriate to decode tail-biting convolutional encoded signals under the mobile WiMAX standard.

In view of this requirement, there is a need for a decoder and method for decoding a tail-biting convolutional encoded signal using Viterbi decoding scheme, where the initial and final states of the encoded signals are unknown.

SUMMARY OF THE INVENTION

A decoder and method for decoding a tail-biting convolutional encoded signal using Viterbi decoding scheme performs a traceback operation for a first portion of a total code block, which includes a code block of the tail-biting convolutional encoded signal and a padded block. During the traceback operation for the first portion, a particular state at a predefined position within the first portion is stored as a circular state. The circular state is used as a traceback starting state for at least one subsequent portion of the total code block to produce a decoded signal of the code block. The use of the circular state facilitates decoding of the code block even though the initial and final states of the code block are unknown. Since the traceback operation is performed on portions of the total code block rather than the entire total code block, the required memory for storing state metric information can be significantly reduced.

A method for decoding a tail-biting convolutional encoded signal using Viterbi decoding scheme in accordance with an embodiment of the invention comprises receiving a code block of the tail-biting convolutional encoded signal and a padded block, the padded block being at least a portion of the code block, the code block and the padded block being parts of a total code block, performing an add-compare-select operation on the total code block to compute state metric information, performing a traceback operation for a first portion of the total code block using the state metric information, including storing a particular state at a predefined position within the first portion as a circular state, and performing the traceback operation for at least one subsequent portion of the total code block using the circular state as a traceback starting state, including selectively executing bit decisions for the at least one subsequent portion to produce a decoded signal of the code block.

A decoder for decoding a tail-biting convolutional encoded signal using Viterbi decoding scheme in accordance with an embodiment of the invention comprises an add-compare-select unit, memory and a traceback unit. The add-compare-select unit is configured to perform an add-compare-select operation on a total code block to compute state metric information for the total code block. The total code block includes a code block of the tail-biting convolutional encoded signal and a padded block. The padded block includes at least a portion of the code block. The memory is operably connected to the add-compare-select unit to store the state metric information. The traceback unit is operably connected to the memory. The traceback unit is configured to perform a traceback operation on a first portion of the total code block using the state metric information. The traceback unit is further configured to store a particular state at a predefined position within the first portion during the traceback operation for the first portion as a circular state. The traceback unit is further configured to perform the traceback operation for at least one subsequent portion of the total code block using the circular state as a traceback starting state. The traceback unit is further configured to selectively execute bit decisions for the at least one subsequent portion to produce a decoded signal of the code block.

Other aspects and advantages of the present invention will become apparent from the following detailed description, taken in conjunction with the accompanying drawings, illustrated by way of example of the principles of the invention.

DETAILED DESCRIPTION

Figure 1:
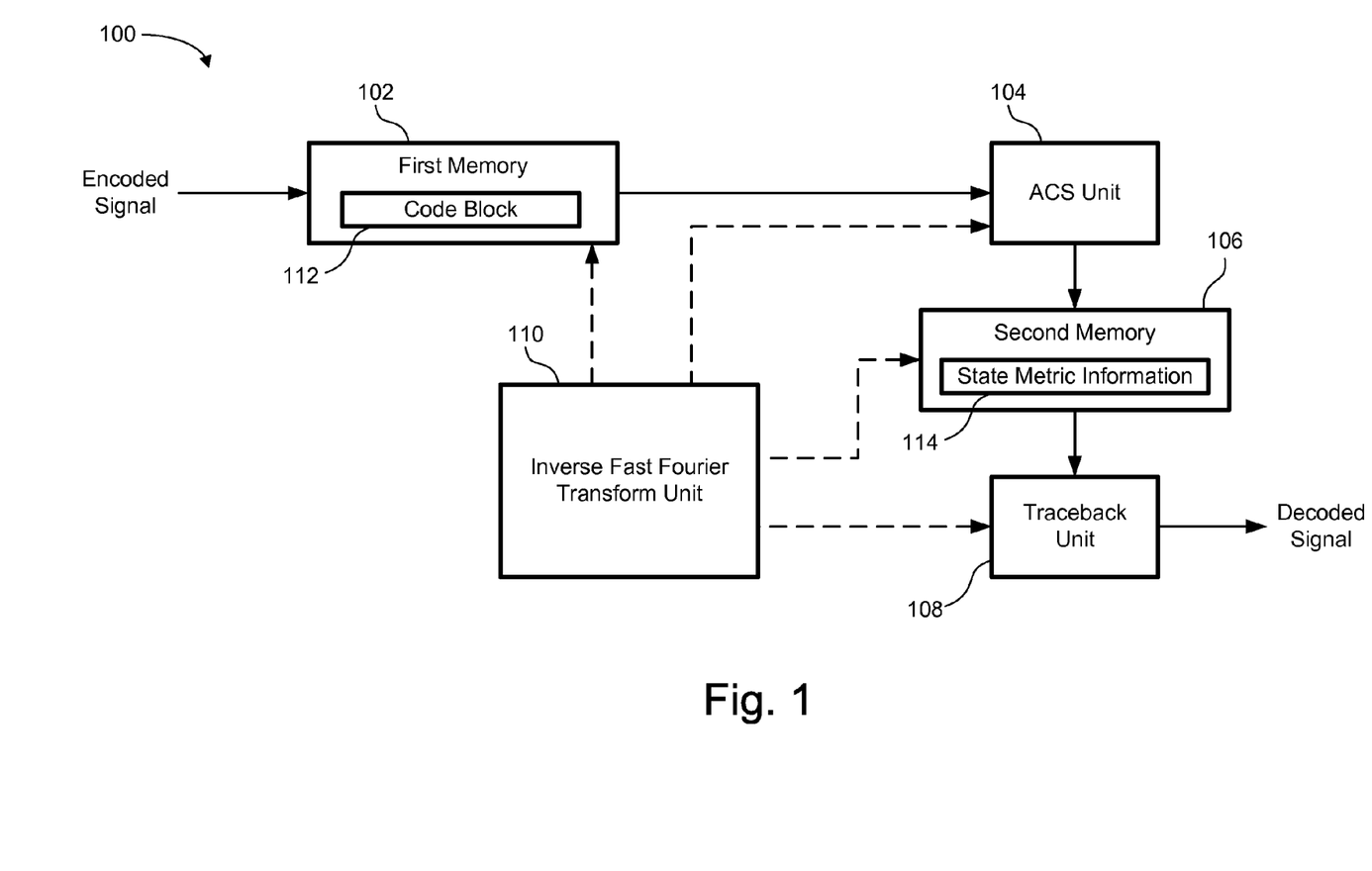
FIG. 1 is a block diagram of a decoder for decoding a tail-biting convolutional encoded signal in accordance with an embodiment of the invention.

With reference to FIG. 1, a decoder 100 in accordance with an embodiment of the invention is shown. The decoder 100 operates to decode signals that have been encoded using a tail-biting convolutional encoding for forward error correction (FEC). The decoder 100 uses a Viterbi decoding scheme to decode a tail-biting convolutional encoded signal in which the initial and final states of the encoded signal are unknown. As described in more detail below, the decoder 100 is designed to perform a Viterbi-based decoding that quickly converges to the correct initial state, which reduces decoding delay. Furthermore, the decoder 100 is designed so that the required memory for decoding is reduced. The decoder 100 can be used in an Orthogonal Frequency Division Multiple (OFDM) based receiver, such as an Orthogonal Frequency Division Multiple Access (OFDMA) receiver.

Figure 2:
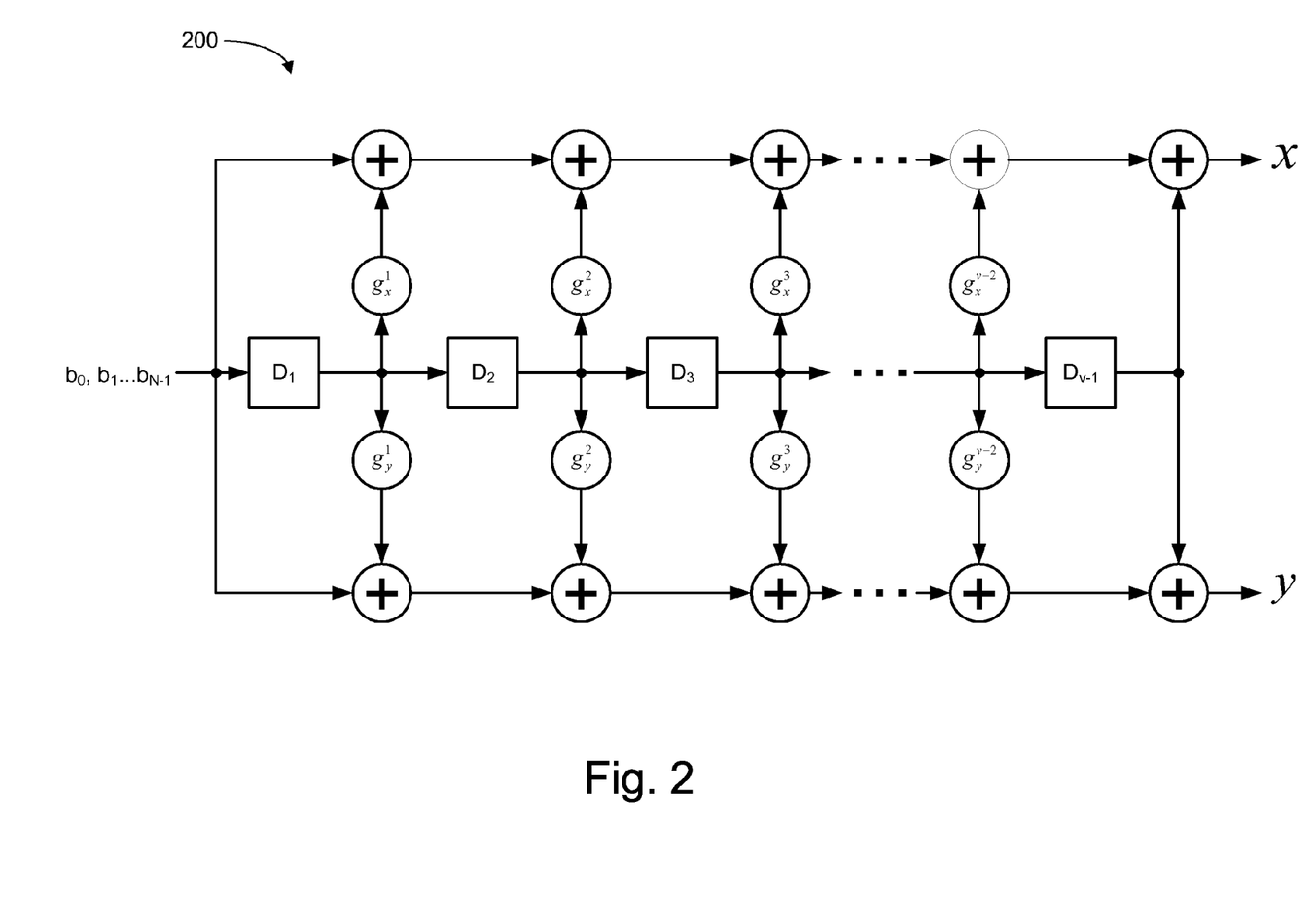
FIG. 2 is a block diagram of a tail-biting convolutional encoder.

Tail-biting convolutional encoded signals are encoded using a convolutional encoder, such as an encoder 200 shown in FIG. 2. The encoder 200 includes a set of shift registers $D_1$, $D_2 \ldots D_{v-1}$ and adders. If a sequence of N information bits $b_0$, $b_1 \ldots b_{N-1}$ is to be encoded, where $b_0$ is encoded first and $b_{N-1}$ is encoded last, the encoder 200 starts the encoding process by first filling up the delay elements, i.e., the shift registers $D_1$, $D_2 \ldots D_{v-1}$, from left to right with the final v-1 information bits $b_{N-1}$, $b_{N-2} \ldots b_{N-(v-1)}$ before encoding begins. Thus, the initial shift register contents, before encoding begins, are $\{D_1, D_2 \ldots D_{v-1}\}=\{b_{N-1}, b_{N-2} \ldots b_{N-(v-1)}\}$. The $g_x$ and $g_y$ sequence shown in FIG. 2 indicate the status of connections to each shift register (i.e., g=1 if there is a connection and g=0 otherwise) for outputs x and y, respectively. Since the final v-1 information bits $b_{N-1}$, $b_{N-2} \ldots b_{N-(v-1)}$ are again in the shift registers $D_1$, $D_2 \ldots D_{v-1}$ when the last information bit $b_{N-1}$ is fed into the encoder 200, the final shift register contents equal the initial shift register contents. Therefore, the initial and final states of the encoded signal are forced to the same state. However, these initial and final states are known only at the transmitter. The only information known to the receiver is that the initial and final states of the encoded signal are the same, which presents a challenge when decoding the encoded signal.

Turning back to FIG. 1, the decoder 100 includes a first memory 102, an add-compare-select (ACS) unit 104, a second memory 106, a traceback unit 108 and control logic 110. The first memory 102 is used to store at least one single code block 112 to be decoded. The length of the code block 112 equals the number of information bits in a single bit sequence before encoding. The ACS unit 104 is configured to perform an ACS operation on a total code block, which includes the code block 112 and a state converge block. The state converge block is a circularly padded block derived from the received code block 112. The length of the state converge block may vary. In some situations, the state converge block may be a small portion of the received code block 112. In other situations, the state converge block may be longer than the received code block 112. The ACS operation performed by the ACS unit 104 is a well-known process of Viterbi decoding, and thus, is not described herein in detail. The ACS operation involves computing state metric information 114 such as state metrics or surviving-branch decisions, which include probabilities of states with respect to reliability at each decision node. The state metric information produced by the ACS unit 104 is stored in the second memory 106 as the ACS operation on the total code block is performed.

The traceback unit 108 of the decoder 100 is configured to perform traceback operations on predefined portions of the total code block using a sliding window, which may have a fixed or variable length, as the ACS operation is being performed on the total code block. As described in more detail below, the traceback unit 108 makes bit decisions during a traceback operation on a section of the total code block only if that section has been traced back during a previous traceback operation, which results in more accurate bit decisions. Furthermore, the traceback unit 108 uses a circular state as the traceback starting state for the last decoding portion of the total block state. That is, the circular state is forced as the traceback starting state for the last decoding portion of the total block state. A circular state is the best or optimal state (i.e., the state with the highest probability with respect to reliability) for a predefined position of the total code block, which corresponds to the beginning of the last decoding portion of the total code block. In an embodiment, the circular state is determined during the traceback operation for a first portion of the total code block. This circular state may be used as the traceback stating state for the last traceback portion of the total code block. Alternatively, the circular state may be updated during the traceback operation for one or more subsequent traceback portions of the total block. The latest up-to-date circular state can then be used as the traceback starting state for the last traceback portion of the total code block.

The control logic 110 of the decoder 100 is configured to control the overall decoding process. In particular, the control logic 110 controls the data transmitted from the first memory 102 to the ACS unit 104. Thus, the control logic 110 determines the total code block, which includes a code block and a padded block, to be processed by the ACS unit 104. Consequently, the length of the total code block is determined by the control logic 110. The control logic 110 also controls when the traceback unit 108 performs a traceback operation so that predefined portions of the total code block are traced back.

Although the ACS unit 104, the traceback unit 108 and the control logic 110 of the decoder 100 are illustrated and described herein as separate units, these components represent functional blocks, and consequently, may or may not be embodied in the form of physically separate units. Thus, some of these components may be combined into integrated modules. Alternatively, one or more of these components may be divided into two or more modules. Furthermore, these components may be implemented in any combination of hardware, firmware and/or software.

The decoding operation of the decoder 100 in accordance with an embodiment of the invention is now described. The decoding operation of the decoder 100 will vary depending on the relative lengths of the code block and the padded block of a total code block being processed. The decoding operation of the decoder 100 when the length of the code block is greater than the length of the padded block will be described first with reference to FIG. 3, which illustrates partial traceback operations on predefined portions of a total code block 302.

Figure 3:
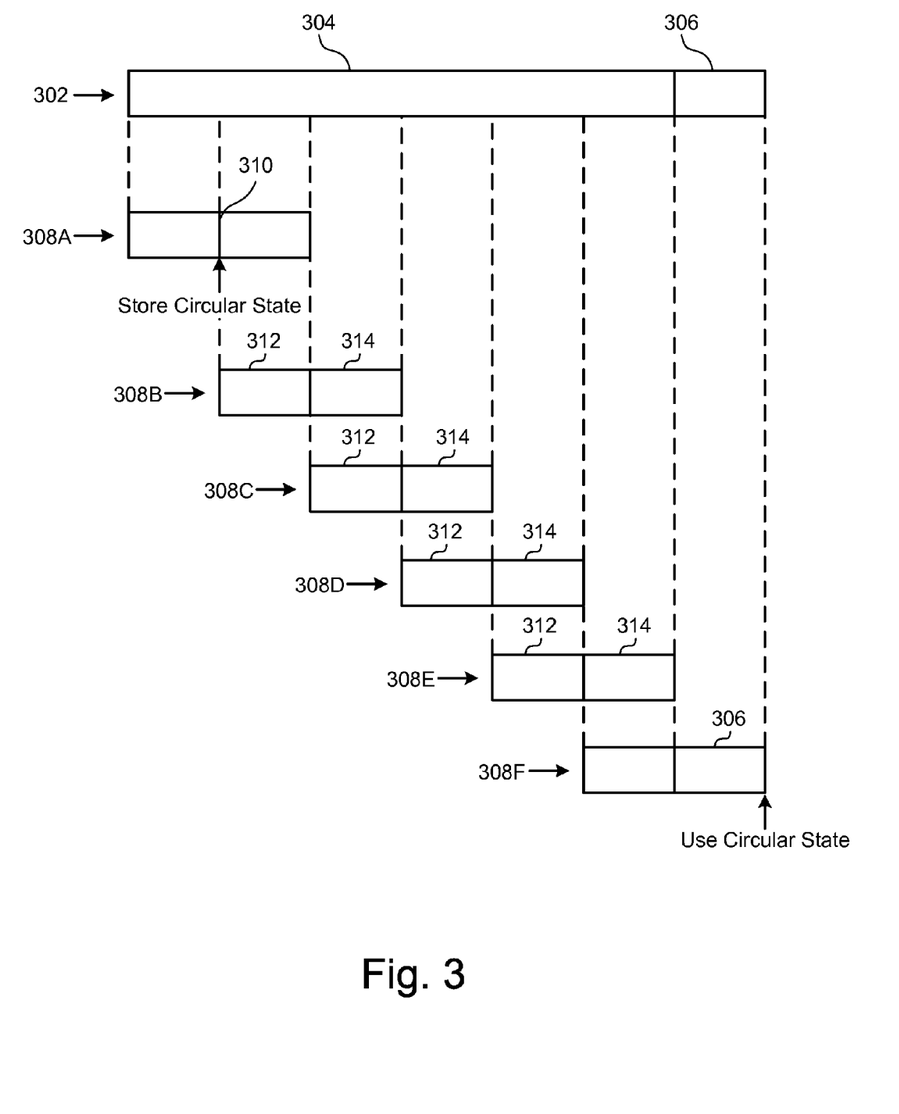
FIG. 3 illustrates a decoding operation of the decoder when the length of a code block being decoded is greater than the length of a padded block in accordance with an embodiment of the invention.

As shown in FIG. 3, the total block 302 includes a code block 304 to be decoded and a padded block 306. As an example, the length of the code block 304 is 288 bits and the length of the padded block 306 is 48 bits. Furthermore, in this example, the length of the traceback window is 96 bits, which equals the length of predefined portions 308A, 308B, 308C, 308D, 308E and 308F of the total code block 302 for which traceback operations will be executed. However, in other embodiments, the code block 304, the padded block 306 and the traceback window may have different lengths.

Initially, the code block 302 to be decoded is stored in the first memory 102. The control logic 110 directs the transmission of the code block 304 from the first memory 102 to the ACS unit 104 to be processed. The control logic 110 also directs the transmission of the padded code block 306 after the code block 304 has been transmitted to the ACS unit 104. Thus, the entire total code block is serially transmitted to the ACS unit 104. In this example, the padded block 306 is a front portion (i.e., first 48 bits) of the total code block 302, which is part of the first predefined portion 308A of the total code block 302. In FIG. 3, the front portion of the total code block 302 is shown to be situated at the left end of the total code block, which first arrives at the ACS unit 104.

The ACS unit 104 performs an ACS operation on the total code block 302 serially from the front of the total code block 302 until the entire total code block has been processed. As the total code block 302 is processed, the ACS unit 104 computes state metric information for the total code block, which is stored in the second memory 106.

After the first predefined portion 308A of the total code block 302 has been processed by the ACS unit 104, the control logic 110 directs the traceback unit 108 to perform a traceback operation on the first predefined portion using the stored state metric information in the second memory 106 for the first predefined portion. The traceback unit 108 performs the traceback operation for the first predefined portion 308A using the best or optimal state at the end of the first predefined portion, i.e., the state with the highest probability at the end of the first predefined portion, as the traceback starting state. During the traceback operation for the first predefined portion 308A, no bit decisions are made for the first predefined portion. However, during the traceback operation for the first predefined portion 308A, the best state at a predetermined position 310 within the first predefined portion is stored as a circular state for subsequent use. The predetermined position 310 within the first predefined portion 308A coincides with the end of the total code block 302, which is the traceback starting position for the last predefined portion 308F of the total code block. Thus, the circular state can be used as the traceback starting state for the last predefined portion 308F of the total code block 302.

After the second predefined portion 308B of the total code block 302 has been processed by the ACS unit 104, the control logic 110 directs the traceback unit 108 to perform a traceback operation on the second predefined portion using the stored state metric information in the second memory 106 for the second predefined portion. The second predefined portion 308B includes an overlapping section 312 and a non-overlapping section 314. As illustrated in FIG. 3, the overlapping section 312 of the second predefined portion 308B is the section of the second predefined portion that overlaps the first predefined portion 308A. The non-overlapping section 314 of the second predefined portion 308B is the section of the second predefined portion that does not overlap the first predefined portion 308A. The traceback unit 108 performs the traceback operation for the second predefined portion 308B using the best state at the end of the second predefined portion as the traceback starting state. Since the overlapping section 312 of the second predefined portion 308B has been previously traced back for the first predefined portion 308A, the traceback operation is performed twice on the overlapping section of the second predefined portion. During the traceback operation for the second predefined portion 308B, bit decisions are made for only the overlapping section 312 of the second predefined portion. No bit decisions are made for the non-overlapping section 314 of the second predefined portion 308B.

The subsequent predefined portions 308C, 308D and 308E, excluding the last predefined portion 308F, are traced back in the same manner as the second predefined portion. Each of these subsequent predefined portions 308C, 308D and 308E includes an overlapping section 312 and a non-overlapping section 314. The overlapping sections 312 of these subsequent predefined portions 308C, 308D and 308E are the sections that overlap the respective previous predefined portion. The non-overlapping sections 314 of these subsequent predefined sections 308C, 308D and 308E are the sections that do not overlap the respective previous predefined portion. In this example, each of the overlapping and non-overlapping sections 312 and 314 of the subsequent predefined sections 308C, 308D and 308E, as well as the second predefined portion 308B, is 48 bits long. The traceback unit 108 performs a traceback operation for each of these subsequent predefined portions 308C, 308D and 308E after that portion has been processed by the ACS unit 104. The traceback unit 108 performs the traceback operation for each of these subsequent predefined portions 308C, 308D and 308E using the best state at the end of that predefined portion as the traceback starting state. The traceback operation is performed twice on the overlapping sections 312 of the subsequent predefined portions 308C, 308D and 308E. During the traceback operation for each of the subsequent predefined portions 308C, 308D and 308E, bit decisions are made for only the overlapping section 312 of that predefined portion. No bit decisions are made for the non-overlapping section 314 of that predefined portion.

After the last predefined portion 308F of the total code block 302 has been processed by the ACS unit 104, the control logic 110 directs the traceback unit 108 to perform a traceback operation for the last predefined portion using the stored state metric information in the second memory 106 for the last predefined portion. Since the last predefined portion 308F includes the padded block 306, the entire last predefined portion has been traced back previously. The padded block 306 has been traced back as part of the first predefined portion 308A. The remaining section of the last predefined portion 308F has been traced back as part of the previous predefined portion 308E. The traceback unit 108 performs the traceback operation for the last predefined portion 308F using the circular state as the traceback starting state. Thus, the circular state is forced to be the traceback starting state for the last predefined portion 308F. During the traceback operation for the last predefined portion 308F, bit decisions are made for the entire length of the last predefined portion.

Since each traceback operation is performed for only a portion of the total code block 302, the state metric information for the entire total code block does not have to be stored in the second memory 106. Thus, the size of the second memory 106 can be significantly reduced.

Figure 4:
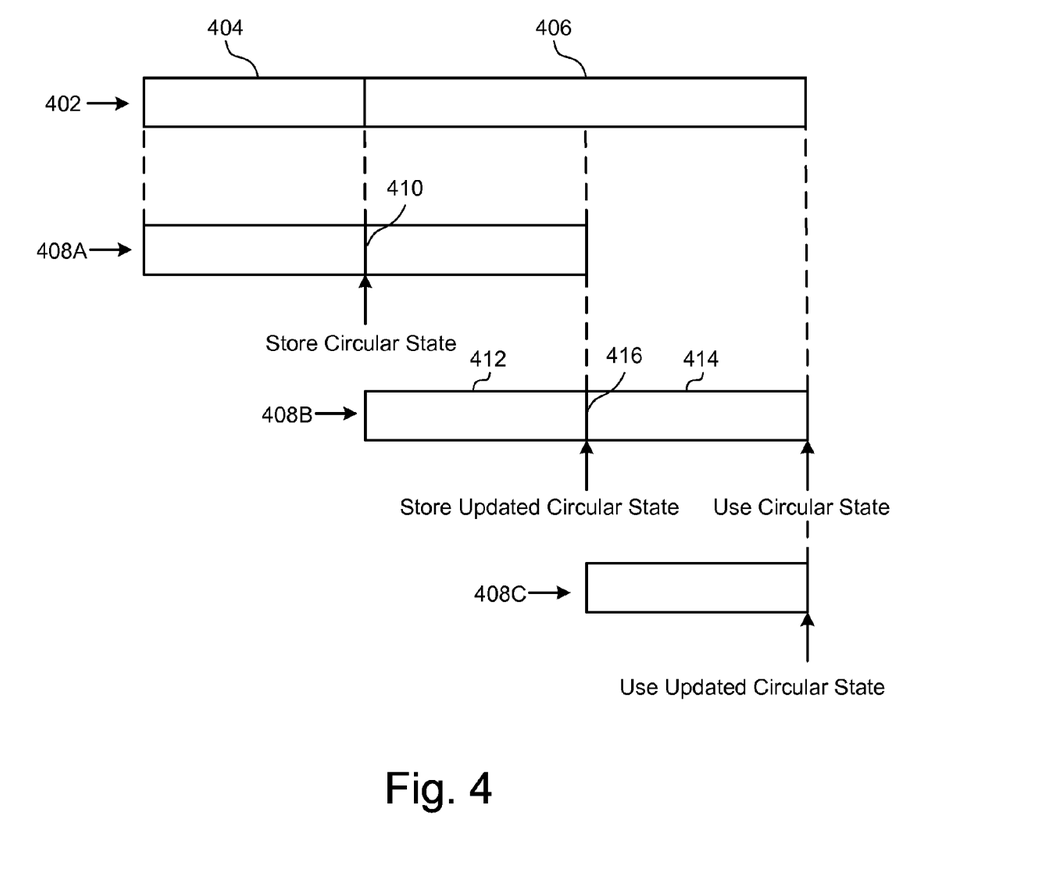
FIG. 4 illustrates a decoding operation of the decoder when the length of a code block being decoded is less than the length of a padded block in accordance with an embodiment of the invention.

The decoding operation of the decoder 100 when the length of the code block is shorter than the length of the padded block will now be described with reference to FIG. 4, which illustrates partial traceback operations on predefined portions of a total code block 402. As shown in FIG. 4, the total code block 402 includes a code block 404 to be decoded and a padded block 406. As an example, the length of the code block 404 is 48 bits and the length of the padded block is 96 bits. Furthermore, in this example, the length of the traceback window is either 96 bits, which equals the length of predefined portions 408A and 408B, or 48 bits, which equals the length of the predefined portion 408C. However, in other embodiments, the code block 404, the padded block 406 and the traceback window may have different lengths.

Initially, the code block 404 to be decoded is stored in the first memory 102. The control logic 110 directs the transmission of the code block 404 from the first memory 102 to the ACS unit 104. The control logic 110 also directs the transmission of the padded code block 406 after the code block 404 has been transmitted to the ACS unit 104. Thus, the entire total code block 402 is serially transmitted to the ACS unit 104. In this example, the padded block 406 includes a multiple of the code block 404. In particular, the length of the padded block 406 is twice the length of the code block 404. However, in other embodiments, the length of the padded block 406 may not be a multiple of the length of the code block 404. In FIG. 4, the front of the total code block 402 is the left end of the total code block, which first arrives at the ACS unit 104.

The ACS unit 104 performs an ACS operation on the total code block 402 serially from the front of the total code block until the entire total code block has been processed. As the total code block 402 is processed, the ACS unit 104 computes state metric information for the total code block, which is stored in the second memory 106.

After the first predefined portion 408A of the total code block 402 has been processed by the ACS unit 104, the control logic 110 directs the traceback unit 108 to perform a traceback operation on the first predefined portion 408A using the stored state metric information in the second memory 106 for the first predefined portion. The traceback unit 104 performs the traceback operation for the first predefined portion 408A using the best state at the end of the first predefined portion as the traceback starting state. During the traceback operation for the first predefined portion 408A, no bit decisions are made for the first predefined portion. However, during the traceback operation for the first predefined portion 408A, the best state at a predetermined position 410 within the first predefined portion is stored as a circular state for subsequent use. The predetermined position 410 within the first predefined portion 408A coincides with the end of the total code block 402, which is the traceback starting position for the second predefined portion 408B of the total code block 402. Thus, the circular state can be used as the traceback starting state for the second predefined portion 408B of the total code block 402.

After the second predefined portion 408B of the total code block 402 has been processed by the ACS unit 104, the control logic 110 directs the traceback unit 108 to perform a traceback operation on the second predefined portion using the stored state metric information in the second memory 106 for the second predefined portion. The second predefined portion 408B includes an overlapping section 412 and a non-overlapping section 414. As illustrated in FIG. 4, the overlapping section 412 of the second predefined portion 408B is the section of the second predefined portion 408B that overlaps the first predefined portion 408A. The non-overlapping section 414 of the second predefined portion 408B is the section of the second predefined portion that does not overlap the first predefined portion 408A. In this example, each of the overlapping and non-overlapping sections 412 of the second predefined section 408B is 48 bits long. The traceback unit 108 performs the traceback operation for the second predefined portion 408B using the current circular state. Since the overlapping section 412 of the second predefined portion 408B has been previously traced back for the first predefined portion 408A, the traceback operation is performed twice on the overlapping section 412 of the second predefined portion 408B. During the traceback operation for the second predefined portion 408B, no bit decisions are made. However, during the traceback operation for the second predefined portion, the best or optimal state at a predetermined position 416 within the second predefined portion 408B is stored as the new updated circular state, replacing the current circular state.

The control logic 110 then directs the traceback unit 108 to perform a traceback operation on the third and last predefined portion 408C using the stored state metric information in the second memory 106 for the last predefined portion. In this example, the last predefined portion 408C is equivalent to the code block 404. Thus, the length of the last predefined portion 408C equals the length of the code block 404. The traceback unit 108 performs the traceback operation for the last predefined portion 408C using the new updated circular state as the traceback starting state. Thus, the new updated circular state is forced to be the traceback starting state for the last predefined portion 408C. During the traceback operation for the last predefined portion 408C, bit decisions are made for the entire length of the last predefined portion, which is equivalent to making bit decisions for the code block 404.

In this situation where the code block size is small, the decoder 100 repeated uses the code block 404 as the padded block 406 to significantly increase the length of the total code block 402 so that Viterbi decoding is performed as if it started with the correct initial state. Thus, the decoding operation of the decoder 100 produces a more accurate bit decisions for the code block 404.

Figure 5:
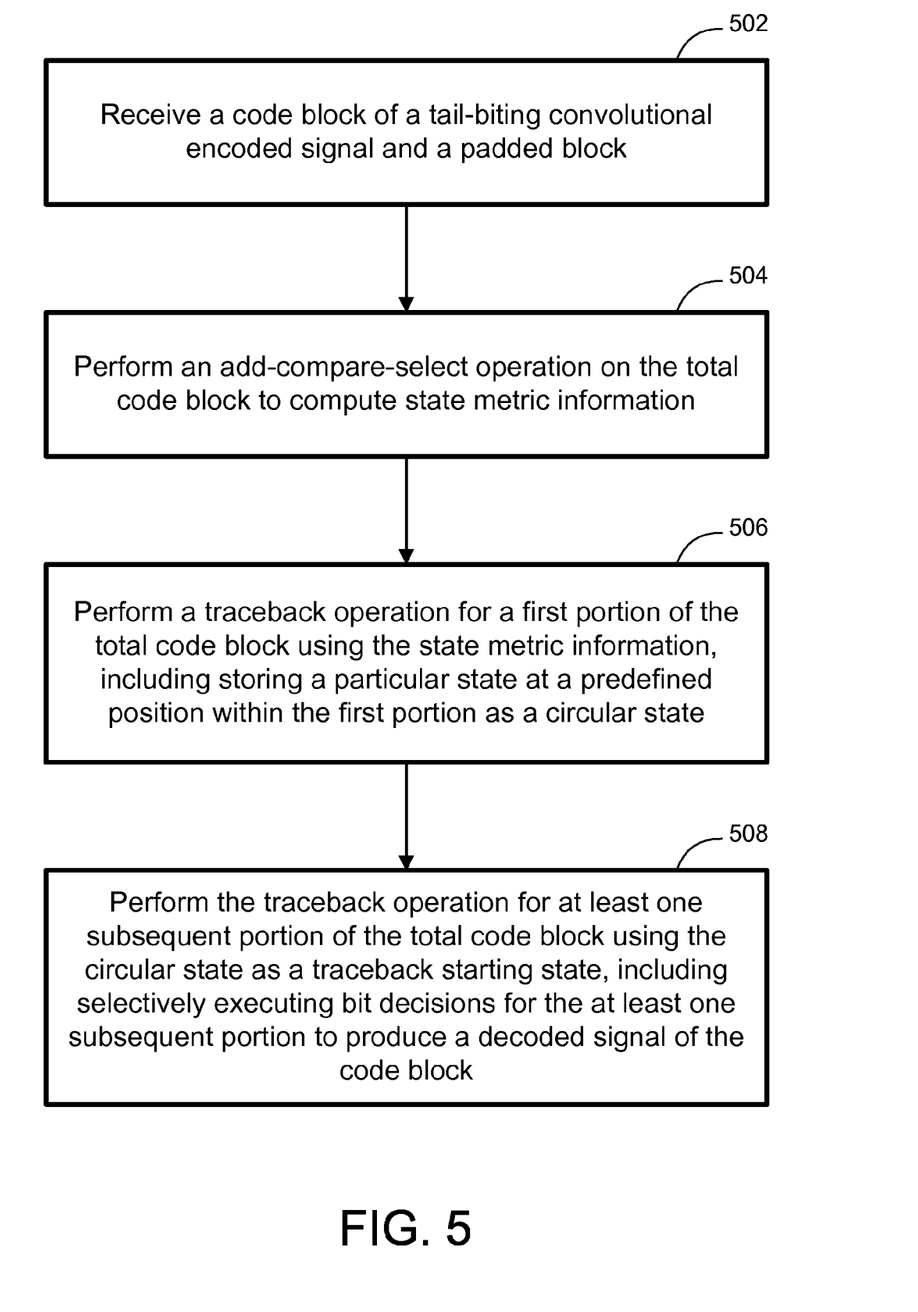
FIG. 5 is a process flow diagram of a method for decoding a tail-biting convolutional encoded signal using Viterbi decoding scheme in accordance with an embodiment of the invention.

A method for decoding a tail-biting convolutional encoded signal using Viterbi decoding scheme in accordance with an embodiment of the invention will be described with reference to a flow diagram of FIG. 5. At block 502, a code block of the tail-biting convolutional encoded signal and a padded block are received. The padded block includes at least a portion of the code block. The code block and the padded block are parts of a total code block. At block 504, an add-compare-select operation is performed on the total code block to compute state metric information. At block 506, a traceback operation is performed for a first portion of the total code block using the state metric information. At block 506, a particular state at a predefined position within the first portion during the traceback operation for the first portion is stored as a circular state. At block 508, the traceback operation is performed for at least one subsequent portion of the total code block using the circular state as a traceback starting state. At block 508, bit decisions are selectively executed for the at least one subsequent portion to produce a decoded signal of the code block.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for decoding a tail-biting convolutional encoded signal using Viterbi decoding scheme, said method comprising:
   receiving a code block of said tail-biting convolutional encoded signal and a padded block, said padded block including at least a portion of said code block, said code block and said padded block being parts of a total code block;
   performing an add-compare-select operation on said total code block to compute state metric information;
   performing a traceback operation for a first portion of said total code block using said state metric information, including storing a particular state at a predefined position within said first portion as a circular state; and performing said traceback operation for at least one subsequent portion of said total code block using said circular state as a traceback starting state, including selectively executing bit decisions for said at least one subsequent portion to produce a decoded signal of said code block.

2. The method of claim 1 wherein said performing said traceback operation for said first portion includes performing said traceback operation for said first portion without executing any bit decisions.

3. The method of claim 1 wherein said particular state is the optimal state for said predefined position.

4. The method of claim 1 wherein said performing said traceback operation for said at least one subsequent portion of said total code block includes performing said traceback operation for a last portion of said total code block using said circular state as a traceback starting state for said last portion, said last portion including at least a portion of said padded block.

5. The method of claim 4 wherein said performing said traceback operation for said last portion includes executing bit decisions for the entire length of said last portion.

6. The method of claim 1 wherein said performing said traceback operation for said at least one subsequent portion of said total code block includes performing said traceback operation for a particular subsequent portion of said total code block and storing another particular state at another predefined position within said particular subsequent portion during said traceback operation for said particular subsequent portion as an updated circular state.

7. The method of claim 6 wherein said performing said traceback operation for said at least one subsequent portion of said total block includes performing said traceback operation for a last portion of said total code block using said updated circular state as a traceback starting state for said last portion, said last portion including at least a portion of said padded block.

8. The method of claim 7 wherein said performing said traceback operation for said last portion includes executing bit decisions for the entire length of said last portion.

9. The method of claim 7 wherein said last portion is equivalent to said code block.

10. The method of claim 7 wherein the length of said padded portion is a multiple of the length of said code block.

11. A decoder for decoding a tail-biting convolutional encoded signal using Viterbi decoding scheme, said decoder comprising:

an add-compare-select unit configured to perform an add-compare-select operation on a total code block to compute state metric information for said total code block, said total code block including a code block of said tail-biting convolutional encoded signal and a padded block, said padded block including at least a portion of said code block;

memory operably connected to said add-compare-select unit to store said state metric information; and a traceback unit operably connected to said memory, said traceback unit being configured to perform a traceback operation on a first portion of said total code block using said state metric information, said traceback unit being further configured to store a particular state at a predefined position within said first portion during said traceback operation for said first portion as a circular state, said traceback unit being further configured to perform said traceback operation for at least one subsequent portion of said total code block using said circular state as a traceback starting state, said traceback unit being further configured to selectively execute bit decisions for said at least one subsequent portion to produce a decoded signal of said code block.

12. The decoder of claim 11 wherein said traceback unit is configured to perform said traceback operation for said first portion without executing any bit decisions.

13. The decoder of claim 11 wherein said particular state is the optimal state for said predefined position.

14. The decoder of claim 11 wherein said traceback unit is configured to perform said traceback operation for a last portion of said total code block using said circular state as a traceback starting state for said last portion, said last portion including at least a portion of said padded block.

15. The decoder of claim 14 wherein said traceback unit is configured to execute bit decisions for the entire length of said last portion during said traceback operation for said last portion.

16. The decoder of claim 11 wherein said traceback unit is configured to perform said traceback operation for a particular subsequent portion of said total code block and to store another particular state at another predefined position within said particular subsequent portion during said traceback operation for said particular subsequent portion as an updated circular state.

17. The decoder of claim 16 wherein said traceback unit is configured to perform said traceback operation for a last portion of said total code block using said updated circular state as a traceback starting state for said last portion, said last portion including at least a portion of said padded block.

18. The decoder of claim 17 wherein said traceback unit is configured to execute bit decisions for the entire length of said last portion during said traceback operation for said last portion.

19. The decoder of claim 17 wherein said last portion is equivalent to said code block.

20. The decoder of claim 17 wherein the length of said padded portion is a multiple of the length of said code block.

* * * * *